(12) United States Patent
Chun

(10) Patent No.: US 10,890,605 B1
(45) Date of Patent: Jan. 12, 2021

(54) LOAD DETECTION CIRCUIT AND LOAD DRIVER HAVING LOAD DETECTION CIRCUIT

(71) Applicant: Samsung Electro-Mechanics Co., Ltd., Suwon-si (KR)

(72) Inventor: Ji Buem Chun, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/852,650

(22) Filed: Apr. 20, 2020

(30) Foreign Application Priority Data

Dec. 24, 2019 (KR) .................. 10-2019-0174160

(51) Int. Cl.
*G01R 19/165* (2006.01)
*H03K 17/687* (2006.01)
*G05F 3/26* (2006.01)

(52) U.S. Cl.
CPC ....... *G01R 19/16552* (2013.01); *G05F 3/262* (2013.01); *H03K 17/6871* (2013.01)

(58) Field of Classification Search
CPC .............. G01R 19/16552; G05F 3/262; H03K 17/6871; H03K 17/687

USPC ......................... 327/108–112; 326/82, 83, 87
See application file for complete search history.

(56) References Cited

U.S. PATENT DOCUMENTS

| | | | |
|---|---|---|---|
| 5,448,175 A | 9/1995 | Nishibe et al. | |
| 2012/0249185 A1* | 10/2012 | Iriarte | H03K 17/0822 327/81 |
| 2018/0183364 A1 | 6/2018 | Lee | |

FOREIGN PATENT DOCUMENTS

| | | |
|---|---|---|
| JP | 6-213939 A | 8/1994 |
| JP | 2018-110511 A | 7/2018 |

* cited by examiner

*Primary Examiner* — Tomi Skibinski
(74) *Attorney, Agent, or Firm* — NSIP Law

(57) ABSTRACT

A circuit with load driver detection includes a reference voltage generation circuit configured to generate a reference voltage based on a reference current, a voltage selection circuit configured to select one of a first detection voltage based on a first driving current through a load and a second detection voltage based on a second driving current flowing through the load, and a detection circuit configured to generate a detection signal, the detection circuit being configured to compare a detection voltage selected by the voltage selection circuit with the reference voltage, wherein the reference voltage is set by the reference voltage generation circuit in response to the load.

18 Claims, 3 Drawing Sheets

NORMAL STATE OF LOAD

<Vd < Vref>

SHORTED STATE OF LOAD

<Vd > Vref>

LOAD DETECTION CIRCUIT AND LOAD DRIVER HAVING LOAD DETECTION CIRCUIT

CROSS-REFERENCE TO RELATED APPLICATIONS

This application claims the benefit under 35 USC 119(a) of Korean Patent Application No. 10-2019-0174160 filed on Dec. 24, 2019 in the Korean Intellectual Property Office, the entire disclosure of which is incorporated herein by reference for all purposes.

BACKGROUND

1. Field

The following description relates to a load state detection circuit and a load driver including a load state detection circuit.

2. Description of Related Art

In general, cameras may include actuators for automatic focusing (AF) and motors, and may be connected to motor drivers used for driving the motors together. The motor drivers may be connected to dedicated processors (AP).

Generally, the maximum driving force of a motor driver may be determined based on the maximum allowable current of the driver and may also be determined based on a supply voltage, an on-resistance of an H-bridge, and load conditions.

For example, at low power supply voltages, there may be many limitations on the maximum driving force of the application, and thus, a circuit design that does not affect the maximum driving force may be used.

On the other hand, a typical short detection circuit, used for detecting a short of the load, may perform sensing using sensing resistance.

However, a typical load short detection method for detecting a load state by using sensing resistance, as described above, may have an issue of lowering the maximum driving force of a motor driver.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a circuit with load driver detection includes a reference voltage generation circuit configured to generate a reference voltage based on a reference current, a voltage selection circuit configured to select one of a first detection voltage based on a first driving current through a load and a second detection voltage based on a second driving current flowing through the load, and a detection circuit configured to generate a detection signal, the detection circuit being configured to compare a detection voltage selected by the voltage selection circuit with the reference voltage, wherein the reference voltage is set by the reference voltage generation circuit to be higher than the detection voltage in response to the load being indicated as being in a normal state based on the detection signal, and the reference voltage is set by the reference voltage circuit to be lower than the detection voltage in response to the load being indicated as being in a shorted state based on the detection signal.

The reference voltage generation circuit may be configured to generate the reference voltage varied in response to a first control signal.

The reference voltage generation circuit may include a current source configured to generate the reference current, a current mirror circuit configured to mirror the reference current as a first current, and a voltage generation circuit configured to generate the reference voltage determined by a sensing resistor and the first current received from the current mirror circuit.

The current mirror circuit may include transistors configured to perform a current mirroring, and may be configured to output the first current lower than the reference current into the voltage generation circuit, dependent on a size ratio of the transistors.

The voltage generation circuit may include a transistor connected to the current mirror circuit by a current mirror of the current mirror circuit, wherein the sensing resistor may be connected between the transistor and a power supply voltage terminal, and wherein the sensing resistor may be varied in response to the first control signal, and the reference voltage may be varied by the sensing resistor.

The voltage selection circuit may be configured to select, dependent on a second control signal, one of the first detection voltage and the second detection voltage.

The detection circuit may be configured to generate a detection signal having a first level in response to the comparison result between the detection voltage and the reference voltage indicating that a state of the load is the normal state, and may be configured to generate a detection signal having a second level different from the first level in response to the comparison result indicating that the state of the load is the shorted state.

The circuit may further include a current transfer circuit including transistors, configured as a current mirror and may be configured to selectively generate one of a first driving current and a second driving current greater than the reference current for the load, based on a size ratio of the transistors.

The circuit may further include a full bridge circuit including a first leg having a first switch and a second switch connected to one end of the load, and a second leg having a third switch and a fourth switch connected to another end of the load, and a gate controller configured to complementarily control a first pair switch including the first switch and a fourth switch, and a second pair switch including the second switch and a third switch.

In another general aspect, a circuit with load driver detection, includes a full bridge circuit including a first leg having a first switch and a second switch connected to one end of a load, and a second leg including a third switch and a fourth switch connected to another end of the load, a gate controller configured to complementarily control a first pair switch including the first switch and a fourth switch, and a second pair switch including the second switch and a third switch, a reference voltage generation circuit configured to generate a reference voltage based on a reference current, a voltage selection circuit configured to select one of a first detection voltage based on a first driving current flowing through the load and a second detection voltage based on a second driving current flowing through the load, and a detection circuit configured to generate a detection signal by comparing a detection voltage selected by the voltage selection circuit with the reference voltage, wherein the reference voltage is set by the reference voltage generation circuit to be higher than the detection voltage in response to the load being indicated as being in a normal state based on the detection signal, and the reference voltage is set by the reference voltage circuit to be lower than the detection voltage in response to the load being indicated as being in a shorted state based on the detection signal.

The gate controller may be configured to generate a first control signal to control the reference voltage, and the reference voltage generation circuit may be configured to generate the reference voltage varied in response to the first control signal.

The reference voltage generation circuit may include a current source configured to generate the reference current, a current mirror circuit configured to current mirror the reference current as a first current, and a voltage generation circuit configured to generate the reference voltage determined by a sensing resistor and the first current received from the current mirror circuit.

The current mirror circuit may include transistors configured to perform a current mirroring, and may be configured to output the first current lower than the reference current into the voltage generation circuit, dependent on a size ratio of the transistors.

The voltage generation circuit may include a transistor connected to the current mirror circuit by a current mirror of the current mirror circuit, wherein the sensing resistor may be connected between the transistor and a power supply voltage terminal, and the sensing resistor may be varied by the first control signal, and the reference voltage may be varied by the sensing resistor.

The gate controller may be configured to generate a second control signal used for selecting the detection voltage in association with a control operation of the first pair switch and the second pair switch, and the voltage selection circuit may be configured to select, dependent on the second control signal, one of the first detection voltage and the second detection voltage.

The detection circuit may be configured to generate a detection signal having a first level in response to the comparison result between the detection voltage and the reference voltage indicating that a state of the load is the normal state, and may be configured to generate a detection signal having a second level different from the first level in response to the comparison result indicating that the state of the load is the shorted state.

The circuit may further include a current transfer circuit including transistors configured as a current mirror, and may be configured to selectively generate one of a first driving current and a second driving current greater than the reference current for the load, dependent on a size ratio of the transistors.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
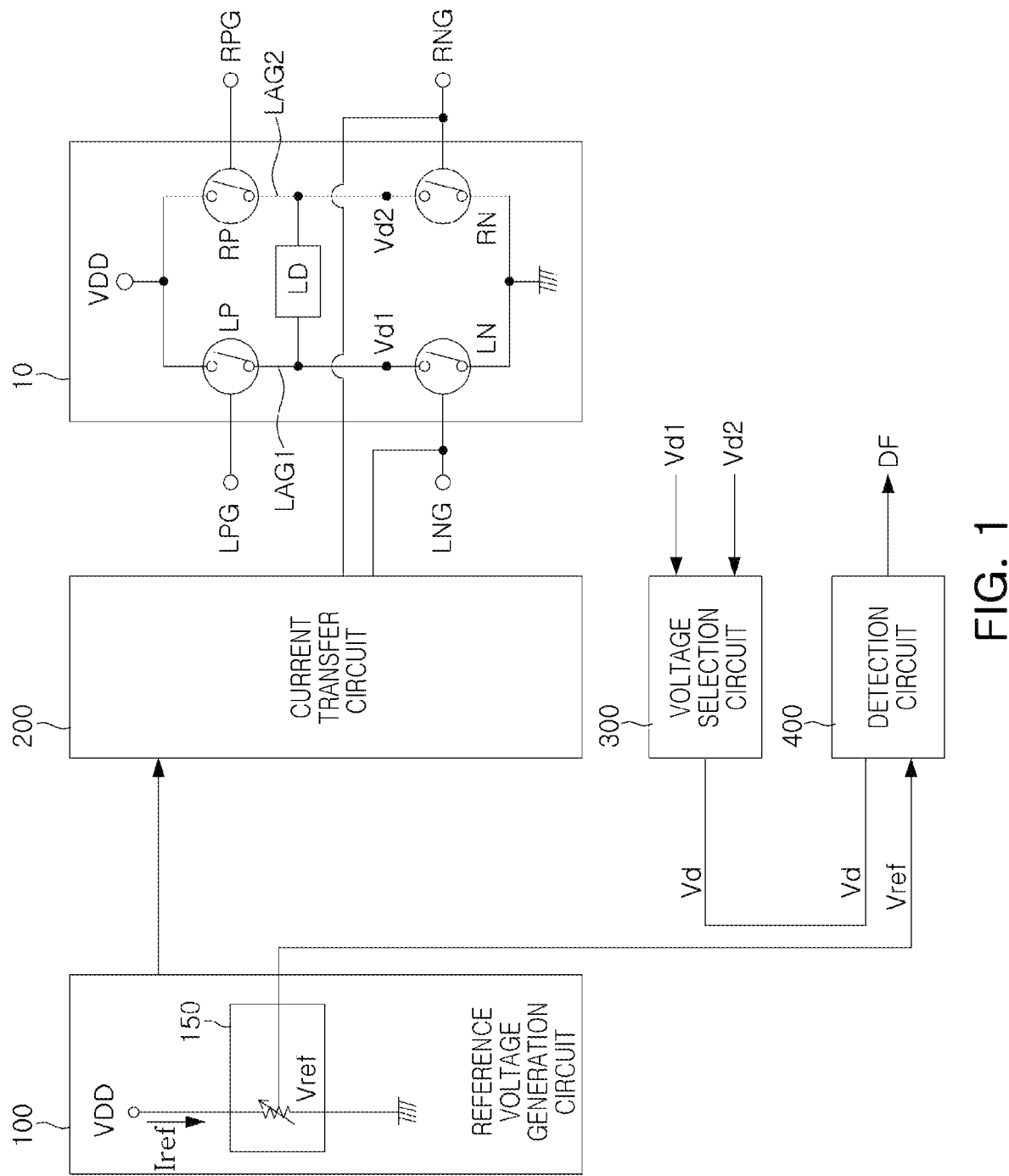
FIG. 1 is a diagram illustrating a load state detection circuit and a load driver according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

One or more examples provide a load state detection circuit that may detect a short circuit of a load affecting a maximum driving current in an application using a low power supply voltage. One or more examples also provide a load driver including such a load state detection circuit.

FIG. 1 is a diagram illustrating a load state detection circuit and a load driver according to an example.

Referring to FIG. 1, a load state detection circuit according to an example may include a reference voltage generation circuit 100, a voltage selection circuit 300, and a detection circuit 400.

Figure 2:
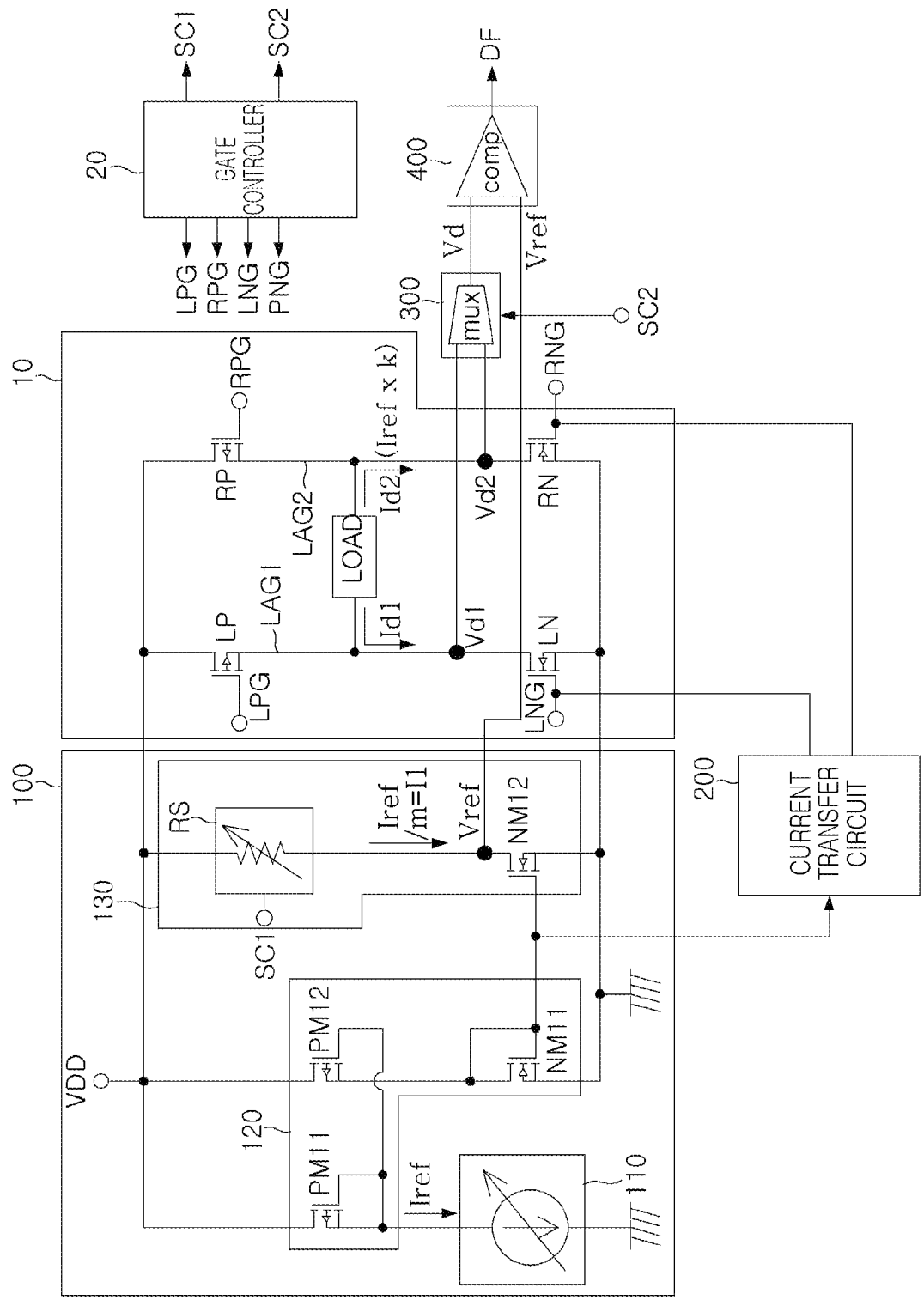
FIG. 2 is a detailed circuit diagram of the load state detection circuit and the load driver.

In addition, a load driver according to an example may include a full bridge or H-bridge circuit 10, a gate controller 20, such as shown in FIG. 2, the reference voltage generation circuit 100, the voltage selection circuit 300, and the detection circuit 400, as a non-limiting example.

The load state detection circuit of the load driver may further include a current transfer circuit 200.

In this disclosure, for convenience of description, the full bridge circuit 10 may be described with respect to a circuit including a full bridge or H-bridge structure as a non-limiting example, but examples are not limited to such an enumerated example, because any circuit that may supply a drive current to a load LD may be used in one or more examples.

The full bridge circuit 10 may include a first leg LAG1 and a second leg LAG2. The first leg LAG1 may include a first switch LP and a second switch LN connected to one end of the load LD. The second leg LAG2 may include a third switch RP and a fourth switch RN connected to the other end of the load LD.

For example, the first switch LP, the second switch LN, the third switch RP, and the fourth switch RN may be controlled by a first gate signal LPG, a second gate signal LGN, a third gate signal RPG and a fourth gate signal RNG, respectively.

In this disclosure, the load LD may correspond to a motor, as a non-limiting example, but the load LD may not be limited to a motor, and the load LD may correspond to other loads in other examples.

The reference voltage generation circuit 100 may generate a reference voltage Vref based on a reference current Iref. For example, the reference voltage Vref may vary based on a change in an internal resistance value.

The current transfer circuit 200 may include a plurality of transistors used for a current mirror, and may use a size ratio of the plurality of transistors to generate a first driving current Id1 or a second driving current Id2 to be greater than the reference current Iref for the load LD.

The voltage selection circuit 300 may output a detection voltage Vd selected from a first detection voltage Vd1 based on the first driving current Id1, such as Id1 as shown in FIG. 2, flowing through the load LD and a second detection voltage Vd2 based on the second driving current Id2, such as Id2 as shown in FIG. 2, flowing through the load LD.

The detection circuit 400 may generate a detection signal DF by comparing the detection voltage Vd, which may be Vd1 or Vd2, selected by the voltage selection circuit 300, by using the reference voltage Vref.

When the load LD is in a normal state, the reference voltage Vref may be set to be higher than the detection voltage Vd, which may be Vd1 or Vd2, and when the load LD is in a shorted state, the reference voltage Vref may be set to be lower than the detection voltage Vd, which may be Vd1 or Vd2.

For example, the detection signal DF may have a low level in a normal state and may have a high level in a shorted state.

In the drawings according to examples, descriptions of same reference numerals and such components having respective same example functions, for example, are omitted for brevity.

FIG. 2 is a detailed circuit diagram of the load state detection circuit and a load driver, such as the load driver of FIG. 1.

Referring to FIG. 2, the gate controller 20 may complementarily control a first pair of switches LP and RN including the first switch LP and the fourth switch RN, and a second pair of switches LN and RP including the second switch LN and the third switch RP.

The gate controller 20 may generate a first control signal SC1 used for controlling the reference voltage Vref.

The gate controller 20 may generate a second control signal SC2 used for selecting the detection voltage Vd, which may be Vd1 or Vd2, in conjunction with the control operation of the first pair of switches LP and RN and the second pair of switches LN and RP.

The gate controller 20 may provide a first gate signal LPG, a second gate signal LNG, a third gate signal RPG, and a fourth gate signal RNG to the first switch LP, the second switch LN, the third switch RP, and the fourth switch RN, respectively.

The reference voltage generation circuit 100 may generate the reference voltage Vref that is varied in response to receiving to the first control signal SC1.

For example, the reference voltage generation circuit 100 may include a current source 110, a current mirror circuit 120, and a voltage generation circuit 130, as a non-limiting example.

The current source 110 may generate the reference current Iref. For example, the current source 110 may generate the reference current Iref that is varied in response to receiving a control signal through a current digital to analog converter IDAC, used for driving a linear driver.

The current mirror circuit 120 may perform a current mirroring of the reference current Iref to produce a first current I1.

The voltage generation circuit 130 may generate the reference voltage Vref, determined depending on the first current I1, and received through the current mirror circuit 120 and a sensing resistor RS.

For example, the current mirror circuit 120 may include a plurality of transistors PM11, PM12 and NM11 used for the current mirroring.

The current mirror circuit 120 may use the size ratio of the plurality of transistors PM11, PM12 and NM11 in order to output the first current I1 to be lower than the reference current Iref when output into the voltage generation circuit 130.

For example, first PMOS PM11 of the current mirror circuit 120 may be connected between the current source 110 and a power supply voltage VDD terminal, and second PMOS PM12 and first NMOS NM11 are connected between the power supply voltage VDD terminal and the ground in series, and second PMOS PM12 may be connected between the power supply voltage VDD terminal and the first NMOS NM11, and may be connected to the first PMOS PM11 to have a current mirroring structure. The first NMOS NM11 may be connected between the second PMOS PM12 and the ground, and may be connected to the voltage generation circuit 130.

For example, the reference current Iref generated by the current source 110 may be transferred from the first PMOS PM11 into the second PMOS PM12 through the current mirror structure, and the current flowing through the second PMOS PM12 may flow through the first NMOS NM11.

For example, the voltage generation circuit 130 may include a second NMOS NM12 that is an NMOS transistor, and also the sensing resistor RS.

The second NMOS NM12 may be connected to the current mirror of the current mirror circuit 120.

The sensing resistor RS may be connected between the transistor NM12 and the power supply voltage VDD terminal.

The sensing resistor RS may cause variation based the first control signal SC1, and the reference voltage Vref may vary based on the varying sensing resistor RS.

For example, the second NMOS NM12 may receive a current flowing through the first NMOS NM11 of the current mirror circuit 120 through the current mirror structure, and the current flowing through the second NMOS NM12 may flow through the sensing resistor RS.

For example, when the relative sizes of the first NMOS NM11 and the second NMOS NM12 have the ratio m:1, based on the reference current Iref flowing through the first NMOS NM11, the first current I1 transferred to the second NMOS NM12 may have a value of Iref/m.

The current transfer circuit 200 may include a plurality of transistors for current mirroring, and may be configured in such a manner that the first driving current Id1 or the second driving current Id2, greater than the reference current Iref, may be generated for the load LD, by using a size ratio of the plurality of transistors, as discussed in greater detail, above.

For example, the first driving current Id1 or the second driving current Id2 may become a current k times higher than the reference current Iref by using the current transfer circuit 200.

The voltage selection circuit 300 may select one of the first detection voltage Vd1 and the second detection voltage Vd2, in response to receiving the second control signal SC2.

For example, the voltage selection circuit 300 may include a multiplexer Mux that is capable of selecting one of the first detection voltage Vd1 and the second detection voltage Vd2.

The detection circuit 400 may compare the detection voltage Vd, such as Vd1 or Vd2, with the reference voltage Vref, and may also generate a detection signal DF having a first level, for example, a low level, when the state of the load LD is normal in the comparison result, and may generate a detection signal DF having a second level, for example, a high level, different from the first level, when the load LD is in a shorted state in the comparison result.

For example, the detection circuit 400 may include a comparator comp that may compare the detection voltage Vd, such as Vd1 or Vd2, with the reference voltage Vref.

Figure 3:
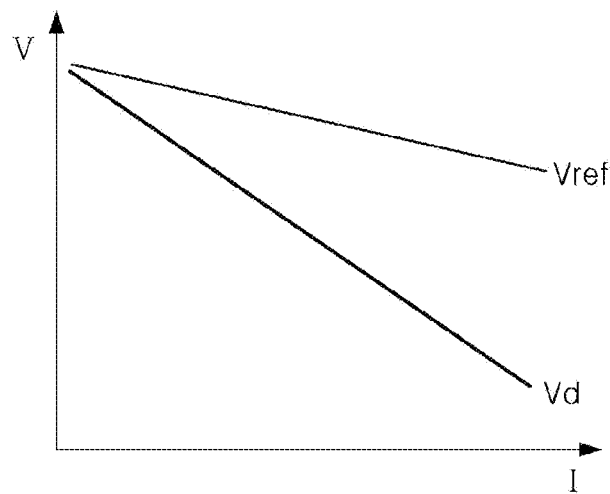
FIG. 3 is a diagram of a reference voltage and a detection voltage in a steady state of a load.
Figure 4:
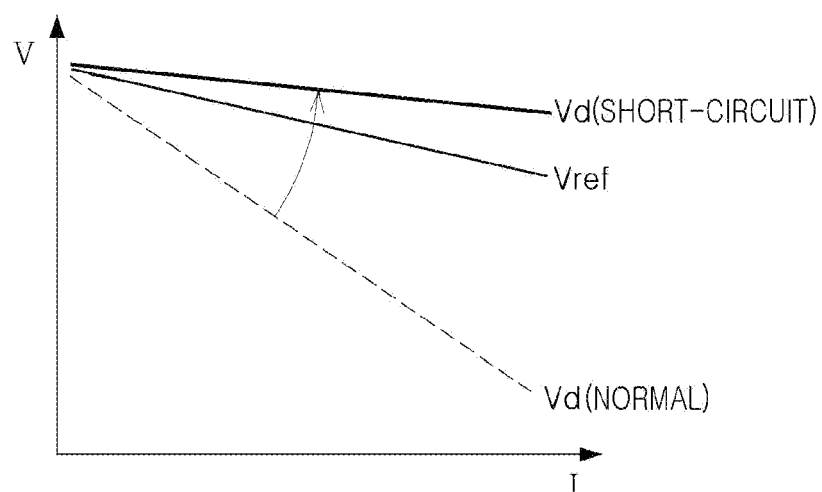
FIG. 4 is a diagram of a reference voltage and a detection voltage in a shorted state of a load.

FIG. 3 is an illustrative diagram of a reference voltage and a detection voltage in a steady state of a load. FIG. 4 is an illustration of a reference voltage and a detection voltage in a shorted state of a load.

Referring to such examples of FIGS. 1 to 4, as described above, in the full bridge circuit 10, the first driving current Id1 may flow through the third switch RP and the second switch LN, and the second driving current Id2 may flow through the first switch NP and the fourth switch RN.

In such an example, the reference voltage Vref may be output, as illustrated in Equation 1, below, from the drain of the second NMOS NM12 of the voltage generation circuit 130.

In addition, the first detection voltage Vd1 may be detected at the drain of the second switch LN of the full bridge circuit 10, and the second detection voltage Vd2 may be detected at the drain of the fourth switch RN as illustrated in the example of Equation 2, below.

$$Vref=VDD-(Iref/m)\times RS=VDD-(I1)\times RS \quad (1)$$

$$Vd1(Vd2)=VDD-(Iref\times k)\times RLD=VDD-Id1 \text{ (or Id2)}\times RLD \quad (2)$$

In Equation 1 and Equation 2, VDD denotes a power supply voltage, m and k each indicate an integer exceeding 1, RS denotes a sensing resistance, and RLD denotes a resistance of a load.

For example, when Iref=500 uA, m may be 50, k may be 200, I1=Iref÷m=500÷50=10 uA, Id1 or Id2=Iref×k=500 uA×200=100 mA, R1=40K ohm, RLD=20 ohm and VDD=2.8 Vm. Thus, Vref=2.4V and Vd1 or Vd2=0.8V.

In this example, when the load is in a steady state, resistance RLD of the load LD may be 20 ohms. In this example, as illustrated in the example of FIG. 3, and as calculated by the above Equation 1 and Equation 2, Vref (2.4V)>Vd1 or Vd2 may be satisfied, in that Vd1 or Vd2 may be 0.8.

On the other hand, when the load LD is in a shorted state, the resistance of the load LD may have a lower resistance value than the resistance when it is in the normal state. For example, the resistance of the load LD in the shorted state may be 1 ohm.

In such an example, as calculated according to Equation 1 and Equation 2, Vref=2.4V and Vd1 or Vd2=2.6V are satisfied, and as illustrated in FIG. 4, Vref<Vd1 or Vd2 may be satisfied, in that Vref may have a value of 2.4 V and Vd1 or Vd2 may have a value of 2.6 V. Thus, in such an example, the detection circuit 400 may detect a shorted state of the load.

On the other hand, the gate controller of the load driver according to an example may be implemented in a computing environment, in which a processor (for example, a central processing unit (CPU), a graphics processing unit (GPU), a microprocessor, an application specific integrated circuit (ASIC), field programmable gate arrays (FPGA), and so on), a memory (for example, a volatile memory (for example, RAM, and so on), or a non-volatile memory (for example, ROM, a flash memory, and so on)), an input device (for example, a keyboard, mouse, pen, voice input devices, touch input devices, infrared cameras, video input devices, and so on), an output device (for example, displays, speakers, printers, and so on), and communication interfaces (for example, modems, network interface cards (NICs), integrated network interfaces, radio frequency transmitters/receivers, infrared ports, USB connections, and so on) are interconnected with each other (for example, peripheral component interconnections (PCI), USB, firmware (IEEE 1394), optical bus structure, network, etc.).

As set forth above, according to an example, a short circuit of a load may be detected without affecting a maximum driving current in an application, using a relatively low power supply voltage.

In greater detail, a maximum driving force of a motor driver is determined by a maximum allowable current of a driver, and in greater detail, because there are many limitations on the maximum driving power in an application using a relatively low power supply voltage; by implementing a circuit capable of detecting a load short, without using a sensing resistor that adversely affects the maximum driving force, a reduction in the maximum driving force of the driver that may be caused by a load detection circuit may be prevented.

As described above, the load short detection circuit does not adversely affect the driving force, and thus, may be applied not only to a camera device but also to a protection circuit in other contexts, such as in an electric iris driver or the like.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit with load driver detection, the circuit comprising:
    a reference voltage generation circuit configured to generate a reference voltage based on a reference current;
    a voltage selection circuit configured to select one of a first detection voltage based on a first driving current through a load and a second detection voltage based on a second driving current flowing through the load; and
    a detection circuit configured to generate a detection signal, the detection circuit being configured to compare a detection voltage selected by the voltage selection circuit with the reference voltage,
    wherein the reference voltage is set by the reference voltage generation circuit to be higher than the detection voltage in response to the load being indicated as being in a normal state based on the detection signal, and the reference voltage is set by the reference voltage circuit to be lower than the detection voltage in response to the load being indicated as being in a shorted state based on the detection signal,
    wherein the reference voltage generation circuit comprises:
        a current source configured to generate the reference current;
        a current mirror circuit configured to mirror the reference current as a first current; and
        a voltage generation circuit configured to receive the first current from the current mirror circuit and generate the reference voltage based on the first current.

2. The circuit of claim 1, wherein the reference voltage generation circuit is further configured to generate the reference voltage such that the reference voltage is varied in response to a control signal.

3. The circuit of claim 2, wherein
    the voltage generation circuit is further configured to generate the reference voltage such that the reference voltage is determined by a sensing resistor and the first current.

4. The circuit of claim 3, wherein the current mirror circuit comprises transistors configured to perform a current mirroring, and is configured to output the first current lower than the reference current into the voltage generation circuit, dependent on a size ratio of the transistors.

5. The circuit of claim 3, wherein the voltage generation circuit comprises:
    a transistor connected to the current mirror circuit by a current mirror of the current mirror circuit,
    wherein the sensing resistor is connected between the transistor and a power supply voltage terminal, and
    wherein the sensing resistor is varied in response to the control signal, and the reference voltage is varied by the sensing resistor.

6. The circuit of claim 1, wherein the voltage selection circuit is further configured to select, dependent on a control signal, one of the first detection voltage and the second detection voltage.

7. The circuit of claim 1, wherein the detection circuit is further configured to generate the detection signal having a first level in response to a result of the comparing of the detection voltage with the reference voltage indicating that a state of the load is the normal state, and is configured to generate the detection signal having a second level different from the first level in response to the result of the comparing indicating that the state of the load is the shorted state.

8. The circuit of claim 1, further comprising:
    a current transfer circuit comprising transistors, configured as a current mirror and configured to selectively generate one of the first driving current and the second driving current that is greater than the reference current for the load, based on a size ratio of the transistors.

9. The circuit of claim 1, further comprising:
    a full bridge circuit comprising a first leg having a first switch and a second switch connected to one end of the load, and a second leg having a third switch and a fourth switch connected to another end of the load; and
a gate controller configured to complementarily control pairs of switches among the first switch, the second switch, the third switch, and the fourth switch.

10. A circuit with load driver detection, comprising:
a full bridge circuit comprising a first leg having a first switch and a second switch connected to one end of a load, and a second leg having a third switch and a fourth switch connected to another end of the load;
a gate controller configured to complementarily control a first pair switch comprising the first switch and a fourth switch, and a second pair switch comprising the second switch and a third switch;
a reference voltage generation circuit configured to generate a reference voltage based on a reference current;
a voltage selection circuit configured to select one of a first detection voltage based on a first driving current flowing through the load and a second detection voltage based on a second driving current flowing through the load; and
a detection circuit configured to generate a detection signal by comparing a detection voltage selected by the voltage selection circuit with the reference voltage,
wherein the reference voltage is set by the reference voltage generation circuit to be higher than the detection voltage in response to the load being indicated as being in a normal state based on the detection signal, and the reference voltage is set by the reference voltage circuit to be lower than the detection voltage in response to the load being indicated as being in a shorted state based on the detection signal,
wherein the reference voltage generation circuit comprises:
a current source configured to generate the reference current;
a current mirror circuit configured to mirror the reference current as a first current; and
a voltage generation circuit configured to receive the first current from the current mirror circuit and generate the reference voltage based on the first current.

11. The circuit of claim 10, wherein the gate controller is further configured to generate a control signal to control the reference voltage, and
the reference voltage generation circuit is configured to generate the reference voltage such that the reference voltage is varied in response to the control signal.

12. The circuit of claim 10, wherein
the voltage generation circuit is further configured to generate the reference voltage such that the reference voltage is determined by a sensing resistor and the first current.

13. The circuit of claim 12, wherein the current mirror circuit comprises transistors configured to perform a current mirroring, and is configured to output the first current lower than the reference current into the voltage generation circuit, dependent on a size ratio of the transistors.

14. The circuit of claim 12, wherein the voltage generation circuit comprises:
a transistor connected to the current mirror circuit by a current mirror of the current mirror circuit,
wherein the sensing resistor is connected between the transistor and a power supply voltage terminal, and
the sensing resistor is varied by the control signal, and the reference voltage is varied by the sensing resistor.

15. The circuit of claim 10, wherein the gate controller is further configured to generate a control signal used for selecting the detection voltage in association with a control operation of the first pair switch and the second pair switch, and
wherein the voltage selection circuit is further configured to select, dependent on the control signal, one of the first detection voltage and the second detection voltage.

16. The circuit of claim 10, wherein the detection circuit is further configured to generate the detection signal having a first level in response to a result of the comparing of the detection voltage with the reference voltage indicating that a state of the load is the normal state, and is configured to generate the detection signal having a second level different from the first level in response to the result of the comparing indicating that the state of the load is the shorted state.

17. The circuit of claim 10, further comprising:
a current transfer circuit comprising transistors configured as a current mirror, and configured to selectively generate one of the first driving current and the second driving current that is greater than the reference current for the load, dependent on a size ratio of the transistors.

18. A circuit with load driver detection, the circuit comprising:
a reference voltage generation circuit configured to generate a reference voltage based on a reference current;
a voltage selection circuit configured to select one of a first detection voltage based on a first driving current through a load and a second detection voltage based on a second driving current flowing through the load;
a detection circuit configured to generate a detection signal, the detection circuit being configured to compare a detection voltage selected by the voltage selection circuit with the reference voltage; and
a current transfer circuit comprising transistors configured as a current mirror, and configured to selectively generate one of the first driving current and the second driving current that is greater than the reference current for the load, dependent on a size ratio of the transistors,
wherein the reference voltage is set by the reference voltage generation circuit to be higher than the detection voltage in response to the load being indicated as being in a normal state based on the detection signal, and the reference voltage is set by the reference voltage circuit to be lower than the detection voltage in response to the load being indicated as being in a shorted state based on the detection signal.

* * * * *